(12) United States Patent
Reynvaan et al.

(10) Patent No.: US 9,490,121 B2
(45) Date of Patent: Nov. 8, 2016

(54) PLASMA-ASSISTED CHEMICAL GAS SEPARATION METHOD HAVING INCREASED PLASMA DENSITY AND DEVICE FOR IMPLEMENTING THE METHOD

(71) Applicant: FRAUNHOFER-GESELLSCHAFT ZUR FÖRDERUNG DER ANGEWANDTEN FORSCHUNG E.V., München (DE)

(72) Inventors: Jacob Reynvaan, Graz (AT); Johannes Grünwald, Taxenbach (AT)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 14/406,258

(22) PCT Filed: May 8, 2013

(86) PCT No.: PCT/EP2013/059643
§ 371 (c)(1),
(2) Date: Dec. 8, 2014

(87) PCT Pub. No.: WO2013/182372
PCT Pub. Date: Dec. 12, 2013

(65) Prior Publication Data
US 2015/0170902 A1   Jun. 18, 2015

(30) Foreign Application Priority Data
Jun. 8, 2012 (DE) .......... 10 2012 209 650

(51) Int. Cl.
*H01L 21/02* (2006.01)
*H01J 37/32* (2006.01)
(Continued)

(52) U.S. Cl.
CPC .......... *H01L 21/0262* (2013.01); *C23C 16/27* (2013.01); *C23C 16/277* (2013.01);
(Continued)

(58) Field of Classification Search
CPC ............. H01L 21/0262; H01L 21/02529; H01L 21/02524; H01L 21/02521; H01L 21/67011; C23C 16/50; C23C 16/517; C23C 16/483; C23C 16/277; C23C 16/27; H01J 37/32532
USPC .................................................. 438/758, 72
See application file for complete search history.

(56) References Cited

U.S. PATENT DOCUMENTS 5,230,740 A * 7/1993 Pinneo ............. H01J 37/32192
118/715
5,314,540 A   5/1994 Nakamura et al.
(Continued)

FOREIGN PATENT DOCUMENTS

DE    19904829 A1   8/1999
DE    102010061487 A1   6/2012
(Continued)

OTHER PUBLICATIONS

Diamond deposition technologies Diamond and Related Materials, 19921116 Elsevier Science Publishers, Amsterdam, NL—ISSN 0925-9635 Bachmann P. K; van Enckevort W vol. 1, Nr:10-11, pp. 1021-1034.
(Continued)

*Primary Examiner* — Caleen Sullivan
(74) *Attorney, Agent, or Firm* — King & Schickli, PLLC

(57) ABSTRACT

The invention relates to a method and a device for coating surfaces of a substrate (8) according to the technique of plasma-assisted chemical vapor deposition. The basic idea of the present invention is to increase the ion concentration prevailing in the plasma so as to have more ions accumulate on the substrate (8) and to promote layer growth (12). According to the invention, the ion concentration is increased by forming a so-called fireball at the surface of the substrate (8) to be coated. The term fireball refers to the ionization processes that occur on electrode surfaces (2) as spontaneous small brightly luminescent phenomena in plasma processes. To this end, an electrode (2) is introduced into an existing background plasma and connected to a positive potential (4).

8 Claims, 1 Drawing Sheet

(51) Int. Cl.
  *C23C 16/27* (2006.01)
  *C23C 16/48* (2006.01)
  *C23C 16/517* (2006.01)
  *C23C 16/50* (2006.01)
  *H01L 21/67* (2006.01)

(52) U.S. Cl.
  CPC ............ *C23C16/483* (2013.01); *C23C 16/50* (2013.01); *C23C 16/517* (2013.01); *H01J 37/32532* (2013.01); *H01L 21/02521* (2013.01); *H01L 21/02524* (2013.01); *H01L 21/02529* (2013.01); *H01L 21/67011* (2013.01)

(56) References Cited

U.S. PATENT DOCUMENTS

| | | | |
|---|---|---|---|
| 6,080,378 A * | 6/2000 | Yokota | C23C 16/274 117/104 |
| 6,375,860 B1 | 4/2002 | Ohkawa et al. | |
| 7,922,880 B1 * | 4/2011 | Pradhan | C23C 14/351 118/723 E |
| 2012/0160167 A1 * | 6/2012 | Alonzo | C03B 37/01876 118/723 I |

FOREIGN PATENT DOCUMENTS

| | | |
|---|---|---|
| EP | 1990443 A2 | 11/2008 |
| JP | S62185879 A | 8/1987 |
| JP | H03267375 A | 11/1991 |
| JP | H0445278 A | 2/1992 |

OTHER PUBLICATIONS

Properties of a differentially pumped constricted hollow anode plasma source;Properties of a differentially pumped constricted hollow anode plasma source Plasma Sources Science and Technology, 20110124 Institute of Physics Publishing, Bristol, GB—ISSN 0963-0252 Mujawar M A; Karkari S K; Turner M M.

CVD diamond thin film technology for MEMS packaging Diamond and Related Materials, 20060201 Elsevier Science Publishers, Amsterdam, NL—ISSN 0925-9635 Zhu X; Aslam D M vol. 15, Nr:2-3, pp. 254-258.

Ion Energy Distribution in Thermionic Vacuum Arc Plasma IEEE Transactions on Plasma Science, 20110601 IEEE Service Center, Piscataway, NJ, US—ISSN 0093-3813 Tiron V; Dobromir M; Pohoata V; Popa G vol. 39, Nr:6, pp. 1403-1407.

* cited by examiner

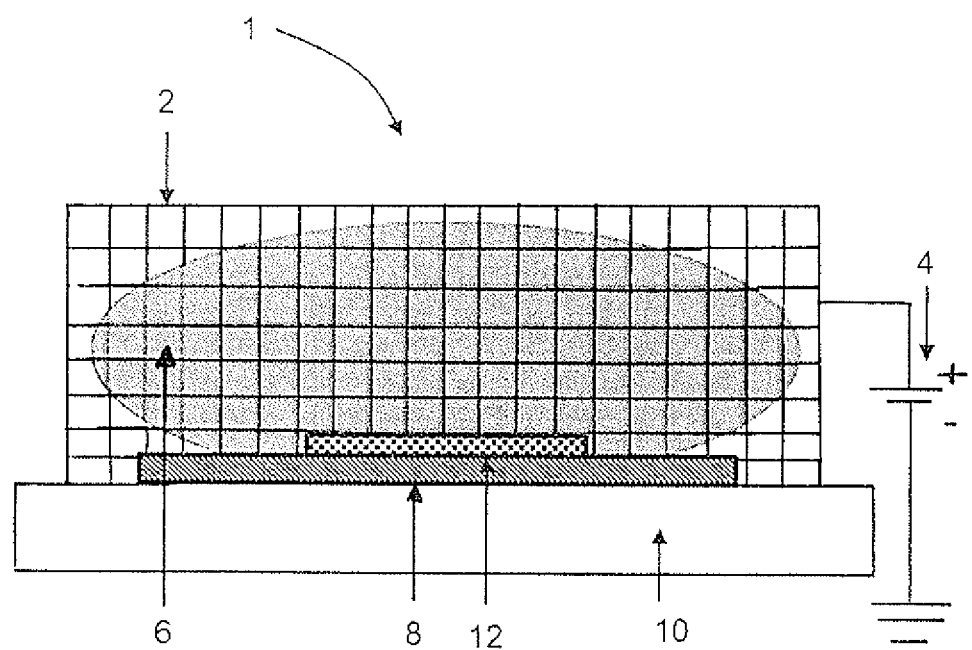

PLASMA-ASSISTED CHEMICAL GAS SEPARATION METHOD HAVING INCREASED PLASMA DENSITY AND DEVICE FOR IMPLEMENTING THE METHOD

FIELD OF THE INVENTION

Background of the Invention

The invention relates to a method and a device for coating surfaces of a substrate according to the method of plasma-assisted chemical vapor deposition.

Chemical vapor deposition CVD refers to a technique for coating substrate surfaces in which a solid is deposited from the gas phase at the surface of a substrate because of chemical reactions of the supplied reaction gases in a reaction chamber. The precipitating solid causes layer growth on the substrate surface, whose homogeneity and growth rate can be influenced by way of process parameters, such as gas concentration and gas pressure or substrate temperature. For example, chemical vapor deposition is used in the semiconductor industry for depositing crystalline silicon or silicon dioxide onto wafer surfaces. Apart from the use in semiconductor production, the CVD method is preferably used in the deposition of synthetic crystalline diamond layers to produce extremely wear-resistant mechanical components or to provide boron-doped diamond-coated electrodes of high efficiency in the field of electrochemical sewage treatment, for example.

There are different types of the CVD method, which can be differentiated according to the manner in which the activation energy is supplied, for example. Apart from purely thermally activated processes, in which the reactants are dissociated at high temperatures by supplying thermal energy and the resulting products promote layer formation, the plasma-assisted CVD process additionally entails an excitement of the reaction gases by a plasma. The chemical compounds of the process gases are partially ionized, the ions striking the substrate to be coated and adding to the layer growth in addition to the radicals produced by breaking up the molecules. The growth rate of the layer to be deposited depends on the density of the plasma, i.e. on the ion concentration. With higher ion concentration in the plasma the layer generally grows faster.

The background plasma can be excited by field ionization by means of a high-frequency electromagnetic field (microwaves). Also, excitement by laser radiation or by impact ionization with high-energy particles, usually electrons, is possible.

The method of plasma-assisted CVD coating is increasingly used in particular in industrial applications. In this competitive field, the coating process represents a significant time and cost factor in production so that efforts are made to accelerate this process step and to thus lower the costs.

Thus, it is the object of the present invention to accelerate the coating process in a plasma-assisted CVD method with regard to a reduction of the production costs.

SUMMARY OF THE INVENTION

This object is attained in connection with the preamble of claim 1 in that the plasma density at the surface of the substrate is increased by forming a fireball that forms at a positively biased electrode surface. The basic idea of the present invention is to increase the ion concentration prevailing in the plasma, which is a reflection of the plasma density, so as to have more ions accumulate on the substrate and to promote layer growth. According to the invention, the ion concentration is increased by forming a fireball at the surface of the substrate to be coated.

It is known from the state of the art that small brightly luminescent phenomena spontaneously occur at electrode surfaces in plasma processes. These ionization processes are also characterized as fireballs. To trigger them, an electrode is introduced into an existing background plasma and connected to a positive potential. First an electron-rich Debye layer forms, which tends to shield off the positive electrode potential in order to maintain the quasineutrality of the surrounding plasma. If the applied positive voltage at the electrode exceeds the ionization potential of the process gas, additional ionization processes occur within the Debye layer, which change the space charge in the vicinity of the electrode surface in such a way that the approximately two-dimensional even layer at the electrode surface swells, forming three-dimensional structures. Said three-dimensional structures are called anode spots or, as of late, fireballs If now such a fireball is formed in the vicinity of the surface of the substrate to be coated, a plasma configuration with localized increased density and particle temperature develops. The increased ion concentration accelerates the layer growth on the substrate introduced into the sphere of action of the fireball, meaning it increases the rate of deposition and leads to the desired layer thicknesses being reached during a shorter stay of the substrate in the reaction chamber and in more continuous coating processes with higher feed rates. Thus, the use of the fireball according to the invention in a plasma-assisted CVD method helps accelerate the coating process and reduce the costs of coating.

As another advantage, the method according to the invention requires less energy and thus causes lower energy costs than the plasma-assisted CVD process used according to the state of the art because less (primary) electrons are necessary for producing the fireball and thus a large portion of the energy for producing the background plasma is eliminated.

In a preferred embodiment, the fireball is excited as an inverted fireball.

Test results according to the state of the art show that fireballs form not only outside the solid electrodes at their electrode surface, but also in the interior of hollow sphere-shaped electrodes that are formed by a highly transparent grid. These "inverted fireballs" were mentioned for the first time in the publication "Transit time instabilities in an inverted fireball. I. Basic properties" and "Transit time instabilities in an inverted fireball. II. Mode jumping and nonlinearities", R. L. Stenzel, J. Gruenwald et al., Physics of Plasmas, Vol. 18, Number 1.

In an advantageous way, the ion concentration in this area is significantly increased and can rise by the factor 40 and more in relation to the plasma density without fireball excitation. Owing to these high plasma densities and high ion temperatures within the fireball, the process pressure and, thus, the process gas consumption can be reduced substantially, which leads to a further saving of costs.

In a further advantageous embodiment, the inverted fireball forms within an interior of a cavity-forming grid electrode.

A cavity-forming grid electrode is introduced into an existing background plasma and biased with a positive potential. As soon as the positive bias exceeds the ionization potential of the used process gas, an inverted fireball forms in the interior of the cavity-forming grid electrode. Its formation takes place because of the electrons that are accelerated by the grid potential and not absorbed by the grid and thus can cause additional impact ionizations. Since, as when considering electrode surfaces, an electron-rich Debye layer also forms around the individual wires of the grid, which tends to shield off the positive space charge of the surrounding plasma, contiguous equipotential areas form along the (surface) area of the grid at some point. Said point is characterized by the Debye layers overlapping and thus "locking" the gaps in the grid for slow electrons.

To control the growth conditions, for example by varying the substrate temperature, a bias voltage can be applied to the substrate, which is made of an electrically conductive material.

Advantageously, the background plasma is excited by laser radiation. The radiation can be performed by means of a focused laser radiation, which additionally increases the efficiency of energy transmission to the reaction gas.

As another option, the background plasma can be excited by supplying electrical and/or magnetic energy. For this purpose, a high frequency electromagnetic microwave field is preferably coupled into the reactor chamber via an antenna device, triggering an electromagnetic gas discharge. Alternatively, purely capacitively or inductively excited plasmas are possible.

Advantageously, the supply of energy per unit of time into the background plasma is reduced once the fireball has formed. Since the ionization process occurring in the fireball is almost self-sustaining, the external plasma source can be shut off almost completely after the initial ignition of the fireball while the fireball survives.

Current methods for producing layers of titanium nitride, silicon nitride, silicon oxide, silicon/metal compounds, tin oxide and silicon carbide are accelerated by applying the method, just like all depositions of silicon carbides, oxides, nitrides and oxynitrides that are based on tetraethyl orthosilicate (TEOS) and depositions of carbon, for example as diamond.

The method is particularly suitable for depositing the following substances:

Depositing a diamond layer from methane and hydrogen, depositing a boron-doped diamond layer by adding an organic boron compound to the reaction gas, depositing a silicon nitride layer from ammonia and dichlorosilane, depositing a silicon oxide layer from silane and oxygen or tetraethyl orthosilicate (TEOS), depositing a silicon/metal compound from tungsten hexafluoride, depositing a silicon carbide layer from hydrogen and methyltrichlorosilane, depositing titanium nitride from tetrakis(dimethylamino) titanium 1 (TDMAT) and nitrogen, depositing silicides, such as tungsten, cobalt or nickel silicide, from organic compounds, such as tungsten hexafluoride 3, depositing tin oxide layers from tin chloride or organotin compounds by means of water vapor or oxygen onto glass, depositing boron carbide.

With regard to a device, the underlying object of the invention is attained in association with the preamble of claim 11 by an electrode surface for forming a fireball, said electrode surface being arranged in the reaction chamber and being positively biased.

This device implements the described method according to the invention. Starting from a known device as it is used in plasma-assisted chemical vapor deposition, an electrode that is introduced into an existing background plasma is connected to a positive potential. When the electrode potential rises, at a certain potential value the brightly luminescent phenomena, called fireballs, begin to form, in whose vicinity the ion concentration rises and leads to a faster layer growth.

Advantageously, the electrode surface is designed as a cavity-forming grid electrode in whose interior an inverted fireball forms. The cavity-forming grid electrode lets an inverted fireball form in its interior with an again increased ion concentration, which is almost self-sustaining and thus advantageously reduces the process costs via a reduced energy supply.

Preferably, the substrate is disposed in an electrically isolated manner in the sphere of action of the fireball. In order to be able to utilize the ion concentration increased by the fireball for the layer growth on the substrate, the substrate is arranged in an area close to the fireball in which the ion concentration is distinctly increased. The electrically isolated arrangement in association with the substrate being made of an electrically conductive material allows a separate bias of the substrate for specifically influencing the course of the process. Hence, the substrate is preferably made of metal or graphite or silicon carbide or silicon or a composite of said substances or a mixture of said substances.

Tungsten is preferably used for producing the cavity-forming grid electrode because of its temperature resistance.

DESCRIPTION OF THE DRAWING FIGURES

Other advantageous embodiment features arise from the following description and from the drawing illustrating a preferred embodiment of the invention by way of example.

FIGURE shows a schematic illustration of the device according to the invention including the formation of an inverted fireball.

DETAILED DESCRIPTION OF THE INVENTION

In the FIGURE, an arrangement of the substantial elements in a reaction chamber of the device 1 according to the invention is schematically illustrated. The reaction gases flow through the reaction chamber, said reaction gases being additionally excited by the accelerated electrons of a plasma. In the reaction chamber, an electrically conductive grid electrode 2 is arranged, which positively biased via a direct-current voltage source 4. The grid electrode 2—schematically illustrated by an even lateral surface—forms a cavity, in which an inverted fireball 6 forms at a certain strength of the bias 4. In the illustrated example, the cavity is designed in the shape of a cube, but it can also have shape of a sphere. In the lower area of the fireball 6, a substrate 8 is arranged in an electrically isolated manner with respect to the grid electrode 2 on a ceramic insulator 10 in a region of increased ion concentration. Because of the chemical reactions of the added reaction gases, a solid is deposited at the surface of the substrate 8, which is brought to a predefined temperature by heating or cooling, where it causes layer growth 12.

The invention claimed is:

1. A method for coating surfaces of a substrate according to the technique of plasma-assisted chemical vapor deposition, comprising increasing the plasma density of an existing background plasma at the surface of the substrate (8) by forming a fireball (6) at a positively biased (4) electrode surface (2), wherein the fireball (6) is excited as an inverted fireball (6), which forms in an interior of a cavity-forming grid electrode (2) and wherein the supply of energy per unit of time into the existing background plasma is reduced once the fireball (6) has formed.

2. The method according to claim 1, characterized in that an electrical bias is applied to the substrate (8).

3. The method according to claim 1, characterized in that the existing background plasma is excited by laser radiation.

4. The method according to claim 1, characterized in that the existing background plasma is excited by supplying electrical and/or magnetic energy.

5. The method according to claim 1, characterized in that a diamond layer is deposited from methane and hydrogen.

6. The method according to claim 1, characterized in that an organic boron compound is added to the reaction gas and thus a boron-doped diamond layer is deposited.

7. The method according to claim 1, characterized in that one of the following deposition processes takes place:
- a silicon nitride layer is deposited from ammonia and di-chlorosilane,
- a silicon oxide layer is deposited from silane and oxygen or tetraethyl orthosilicate,
- a silicon/metal compound is deposited from tungsten hexafluoride,
- a silicon carbide layer is deposited from hydrogen and methyl-trichlorosilane,
- titanium nitride is deposited from tetrakis(dimethylamino)titanium 1 (TDMAT) and nitrogen,
- silicides are deposited from organic compounds,
- tin oxide layers are coated onto glass from tin chloride or organotin compounds by means of water vapor or oxygen,
- boron carbide is deposited.

8. A device for coating surfaces of a substrate (8) according to the technique of plasma-assisted chemical vapor deposition method of claim 1, comprising an electrode surface (2) for forming the inverted fireball (6), said electrode surface being arranged in a reaction chamber and being positively biased (4) and being designed as a cavity forming grid electrode (2), the inverted fireball forming in its interior.

* * * * *